United States Patent
Hairston

(10) Patent No.: US 7,151,412 B2
(45) Date of Patent: Dec. 19, 2006

(54) SLIDING CASCODE CIRCUIT

(75) Inventor: Allen W Hairston, Andover, MA (US)

(73) Assignee: Bae Systems Information and Electronic Systems Integration Inc., Nashua, NH (US)

( * ) Notice: Subject to any disclaimer, the term of this patent is extended or adjusted under 35 U.S.C. 154(b) by 27 days.

(21) Appl. No.: 10/929,604

(22) Filed: Aug. 30, 2004

(65) Prior Publication Data

US 2006/0044071 A1 Mar. 2, 2006

(51) Int. Cl.
H03F 3/16 (2006.01)

(52) U.S. Cl. .................. 330/311; 330/277; 330/291

(58) Field of Classification Search .............. None
See application file for complete search history.

(56) References Cited

U.S. PATENT DOCUMENTS

| | | | |
|---|---|---|---|
| 4,366,446 A | 12/1982 | Henderson et al. | |
| 4,496,908 A * | 1/1985 | Takano et al. | 330/277 |
| 4,587,495 A | 5/1986 | Osawa et al. | |
| 5,006,817 A | 4/1991 | Babanezhad | |
| 5,301,305 A | 4/1994 | Brunolli | |
| 5,434,544 A | 7/1995 | Van Veenendaal | |
| 5,559,472 A * | 9/1996 | Kobayashi | 330/293 |
| 5,742,183 A * | 4/1998 | Kuroda | 326/81 |
| 6,469,579 B1 | 10/2002 | Bazes | |
| 6,515,547 B1 * | 2/2003 | Sowlati | 330/311 |
| 6,670,851 B1 | 12/2003 | Hojabri et al. | |
| 6,684,065 B1 | 1/2004 | Bult et al. | |
| 2002/0079978 A1 | 6/2002 | Kozu | |
| 2002/0175757 A1 | 11/2002 | Sun | |
| 2002/0196086 A1 | 12/2002 | Sowlati | |
| 2003/0011008 A1 | 1/2003 | Nelson | |
| 2003/0016086 A1 | 1/2003 | Yang | |
| 2003/0090321 A1 | 5/2003 | Parkhurst et al. | |
| 2003/0128072 A1 | 7/2003 | Tran et al. | |
| 2003/0184388 A1 | 10/2003 | Wilson et al. | |
| 2004/0085130 A1 | 5/2004 | Luo | |
| 2004/0100824 A1 | 5/2004 | Le et al. | |
| 2004/0120175 A1 | 6/2004 | Schrom et al. | |
| 2005/0024150 A1 * | 2/2005 | Gordon et al. | 330/307 |

OTHER PUBLICATIONS

Schilling et al., Electronic Circuits: Discrete and Integrated, 1979, McGraw-Hill Inc., Second Edition, p. 145-146.*
Miller, M.H., "Cascode Amplifier Transfer Characteristic", pp. 1-2, University of Michigan-Dearborn.
Lundberg, Kent H., "Transistor Cascode Topology", http://web.mit.edu/klund/www/cascode.html.,Apr. 13, 2004, pp. 1-3.
NYGAARD, Knut Harald, "Classical Class A Amplifier", http://home.no.net/andiha/articles/audio/claclassa.htm., 2002, pp. 1-7.
Alarcon, E. et al. "Current-mode BiCMOS sliding-mode controller circuit for AC signal generation in switching power DC-DC converters", IEEE Midwest Symposium on Circuits and Systems, 1999. pp. 1-5.

* cited by examiner

Primary Examiner—Benny Lee
Assistant Examiner—Alan Wong
(74) Attorney, Agent, or Firm—Maine & Asmus

(57) ABSTRACT

Described techniques extend (e.g., by a factor of 2) the dynamic range of voltage swing for amplifiers and other integrated circuits (e.g., buffers) that are fabricated using lower voltage rated semiconductor processes. Such processes include, for instance, thin gate oxide MOS, and other semiconductor processes that provide desirable features that are typically not associated with high voltage processes, such as increased radiation hardness, higher speed logic, and compactness. Thus, relatively large dynamic range is enabled for integrated circuits fabricated using feature-rich lower voltage rated semiconductor processes.

19 Claims, 4 Drawing Sheets

SLIDING CASCODE CIRCUIT

STATEMENT OF GOVERNMENT INTEREST

Portions of the present invention may have been made in conjunction with Government funding under contract number DTRA 01-03-D-0007-0002, and there may be certain rights to the United States Government.

FIELD OF THE INVENTION

The invention relates to integrated circuits, and more particularly, to a sliding cascode circuit configuration that extends the range of voltage swing to twice the process rating for a single field effect transistor (FET).

BACKGROUND OF THE INVENTION

Typical amplifiers designs include single-FET amplifier stages and two-FET amplifier stages. Single-transistor designs are generally configured in one of three ways: common-source (common-emitter for bipolar transistors), common gate (common-base for bipolar transistors), and common drain or source follower (common-collector or emitter follower for bipolar transistors). A derivation on the common-source (common-emitter) configuration is referred to as a common-source (common-emitter) amplifier with source degeneration, which includes an emitter resistance that effectively lowers the gain of the amplifier.

Two-transistor amplifier designs are generally configured as follows: common-drain-common-source (common-collector-common-emitter for bipolar transistors), common-drain-common-drain (common-collector-common-collector for bipolar transistors), common-source-common-gate or cascode (common-emitter-common-base for bipolar transistors), and the common-drain-common-gate (common-collector-common-base for bipolar transistors). Recall that "Darlington pair" is sometimes used to refer to specific common-drain-common-source (common-collector-common-emitter) and common-drain-common-drain (common-collector-common-collector) configurations.

These single and/or two stage amplifier configurations can be used to form the stages of a multistage amplifier, with each stage providing various characteristics including input resistance, output resistance, voltage gain, and current gain. For instance, a typical cascode configuration (common-source-common-gate for FET amplifiers or common-emitter-common-base bipolar transistor amplifiers) has the input characteristics of a common source (common emitter) amplifier, and the output characteristics of a common gate (common base) amplifier.

Such an amplifier configuration provides a very high output resistance, which generally enables high voltage gain. In addition, no high frequency feedback from the output back to the input occurs, and the input Miller capacitance effect is minimized due to the low voltage gain of the common source (common emitter) configuration. In any such configurations, the amplifiers can be implemented in monolithic form (as an integrated circuit) or with a number of discrete components (separate active and passive components, such as transistors, capacitors and resistors).

The technology used to fabricate integrated circuits generally presents the circuit designer with a number of cost and process constraints for any one application. A primary cost constraint in the context of integrated circuits is the die area required to make an integrated circuit (IC) device. For example, an increased pin count of an IC package equates to increased package size, which increases cost per IC device. Process constraints, on the other hand, are more directly tied to the particular application in which the IC device is to be used.

For instance, metal oxide semiconductor (MOS) FETs are commonly used in the realization of integrated circuits configured to provide amplification of analog signals. In some applications, both dynamic range of the amplifier and radiation hardness of the materials that make up the amplifier IC are desirable traits. Dynamic range is generally the voltage range in which an amplifier can operate while meeting the performance requirements of the circuit. Radiation hardness is the characteristic of a material that indicates the extent to which that material can withstand nuclear or other radiation. There is a trade, however, between dynamic range and radiation hardness.

On one hand, the radiation hardness rating is higher (better) for integrated circuits made with thin gated oxide CMOS processes. On the other hand, the voltage range allowed by a FET fabricated with thin gated oxide CMOS processes is lower, relative to other IC processes. Typically, the trade is satisfied by favoring the higher voltage range, thereby necessitating the use of higher voltage range processes (as opposed to the favorable thinner gated oxide CMOS processes). A number of undesirable features are associated with these higher voltage range processes, such as reduced radiation hardness, larger layout die area, and slower speed. In addition, the range of the amplifier voltage swing is still limited by process ratings for a single FET.

What is needed, therefore, are techniques for extending the dynamic range of voltage swing for amplifiers and other integrated circuits fabricated using lower voltage rated processes that provide desirable features such as increased radiation hardness, higher speed logic, and compactness.

SUMMARY OF THE INVENTION

One embodiment of the present invention provides a sliding cascode circuit. The circuit includes a first transistor having a gate, source and drain, with its source coupled to a first voltage supply and its gate adapted to receive an input signal. A second transistor having a gate, source and drain, has its drain coupled to an output node, and its source coupled to the drain of the first transistor. A first impedance is coupled from the first voltage supply to the gate of the second transistor, and a second impedance is coupled from the gate of the second transistor to the output node. The first and second impedances form a feedback network that distributes voltage at the output node across the first and second transistors, thereby increasing maximum voltage swing of the circuit relative to a single transistor configuration.

The circuit may further include a third transistor having a gate, source and drain, with its drain coupled to a first bias voltage source, its source coupled to the gate of the second transistor, and its gate adapted to receive control signals that turn the third transistor on and off in order to set a DC operating point of the circuit. In one particular embodiment, the first and second impedances have substantially the same value, thereby enabling voltage at the output node to be evenly distributed across the first and second transistors. The first and second impedances can be, for example, capacitors or resistors. The first, second, and third transistors can be, for example, PFETs or NFETs.

Another embodiment of the present invention provides an integrator with sliding cascode amplifier circuit. The circuit includes a first transistor having a gate, source and drain, with its source coupled to a first voltage supply and its gate adapted to receive an input signal. A second transistor having a gate, source and drain, has its drain coupled to an output node, and its source coupled to the drain of the first transistor. A first impedance is coupled from the first voltage supply to the gate of the second transistor, and a second impedance is coupled from the gate of the second transistor to the output node. An integration capacitor is coupled from the input node to the output node. The first and second impedances form a feedback network that distributes voltage at the output node across the first and second transistors, thereby increasing maximum voltage swing of the circuit relative to a single transistor configuration.

The circuit may further include a cascode reset switch that is operatively coupled to the circuit and adapted for coupling a reset voltage to the feedback network in response to a cascode reset signal. An integration reset switch is operatively coupled to the circuit, and is adapted for enabling an integration reset function in response to an integration reset signal. Note that the cascode reset switch can be opened before the integration reset switch is opened to begin integration, so as to enable the feedback before integration begins. The first and second impedances (e.g., two capacitors or two resistors) may have substantially the same value, thereby enabling voltage at the output node to be evenly distributed across the first and second transistors.

The circuit may further include a third transistor having a gate, source and drain, with its source coupled to a second voltage supply and its gate adapted to receive an amplifier bias voltage signal. A fourth transistor having a gate, source and drain, has its drain coupled to the output node, and its source coupled to the drain of the third transistor. A third impedance is coupled from the second voltage supply to the gate of the fourth transistor, and a fourth impedance is coupled from the gate of the fourth transistor to the output node. The third and fourth impedances form a second feedback network that distributes voltage at the output node across the third and forth transistors, thereby further increasing the maximum voltage swing.

In one such embodiment, the circuit further includes a cascode reset switch that is operatively coupled to the circuit and adapted for coupling a reset voltage to the second feedback network in response to a cascode reset signal, and an integration reset switch that is operatively coupled to the circuit and adapted for enabling an integration reset function in response to an integration reset signal. The cascode reset switch can be opened before the integration reset switch is opened to begin integration, as previously explained. The third and fourth impedances (e.g., two capacitors or two resistors) may have substantially the same value, thereby enabling voltage at the output node to be evenly distributed across the third and fourth transistors.

Another embodiment of the present invention provides a sliding cascode source follower circuit. The circuit includes a first transistor having a gate, source and drain, with its source providing an output node and adapted for coupling with a current source, and its gate adapted to receive an input signal. A second transistor having a gate, source and drain, has its drain coupled to a voltage supply, and its source coupled to the drain of the first transistor. A first impedance is coupled from the first voltage supply to the gate of the second transistor, and a second impedance is coupled from the gate of the second transistor to the output node. The first and second impedances form a feedback network that distributes voltage at the output node across the first and second transistors, thereby increasing maximum voltage swing of the circuit relative to a single transistor configuration.

As will be appreciated in light of this disclosure, the sliding cascode circuit can be fabricated using a semiconductor process that is associated with a voltage rating for a single transistor, such as thin oxide CMOS. The feedback network distributes voltage at the output node across the first and second transistors, thereby increasing maximum voltage swing of the circuit relative to that semiconductor process voltage rating for a single transistor. The impedance network can be configured so to enable voltage at the output node to be evenly distributed across the first and second transistors, while other configurations may distribute the voltage unevenly. For example, the feedback network can be configured so as to drop 60% of the output voltage across the first transistor and 40% across the second transistor.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Embodiments of the present invention extend the dynamic range of voltage swing for amplifiers and other integrated circuits that are fabricated using lower voltage rated semiconductor processes. Such processes include, for instance, thin gate oxide MOS, and other semiconductor processes that provide desirable features that are typically not associated with high voltage processes, such as increased radiation hardness, higher speed logic, and compactness. Thin gate oxide MOS processes include positive-channel MOS (PMOS), negative-channel MOS (NMOS), and complementary MOS (CMOS), which is a combination of PMOS and NMOS.

In one particular embodiment, a sliding cascode FET amplifier is fabricated using thin gate oxide processes (e.g., PMOS FET, NMOS FET, or combination). Each stage of the amplifier includes two FETs configured in a sliding cascode configuration as explained herein. The voltage range of amplifier swing is extended to twice the process rating for a single FET. Thus, the conventionally required trade between a large dynamic range and lower voltage rated semiconductor processes is neutralized. The result is a large voltage swing amplifier having increased radiation hardness, using a fabrication process that supports higher speed logic, and compact design.

Numerous applications are possible here, where radiation-hardened integrated circuits or other circuit designs that would benefit from extended voltage range beyond the process limit, are enabled.

One such application where both high dynamic range and radiation hardness are desirable is a read out circuit (ROIC) of a focal plane array (FPA). In more detail, an FPA detects radiation (e.g., infrared) from a scene. Analog detection signals generated by the active pixels of the FPA are integrated, amplified, and then converted in to their digital equivalents before being passed to image processing circuitry. The integration and amplification can be carried out by an integrator amplifier circuit configured with sliding cascode circuits as described herein.

Sliding Cascode Circuit

Figure 1:
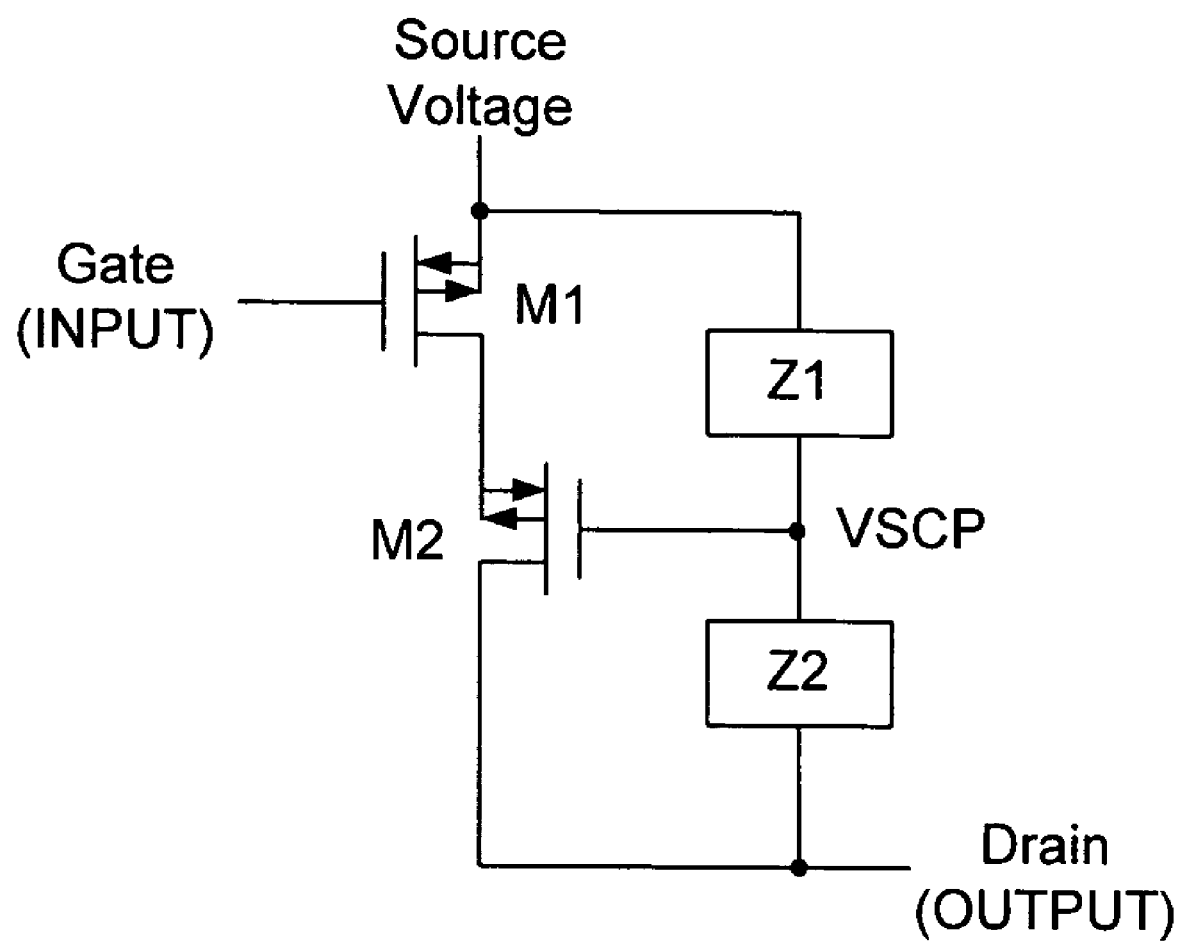
FIG. 1 illustrates a sliding cascode circuit configured in accordance with one embodiment of the present invention.

FIG. 1 illustrates a sliding cascode circuit configured in accordance with one embodiment of the present invention. The sliding cascode circuit functionally replaces a single FET with two FETS (M1 and M2) to increase the output voltage range at the drain of FET M2. An input signal is provided at the INPUT node of the circuit, which is at the gate of FET M1. This input signal is amplified by operation of FETs M1 and M2. The amplified output signal is provided at the OUTPUT node of the circuit, which is at the drain of FET M2.

FET M2 is the cascode FET, and is controlled by a bias VSCP. This cascode FET M2 sets the voltage on the drain of FET M1, and buffers the output current at its drain (the OUTPUT node). The bias VSCP is generated by feedback from the OUTPUT node, and adjusts the drain-to-source voltages of the two FETs M1 and M2 so as to distribute the total voltage drop evenly across the two FETs M1 and M2 for all output voltage levels at the OUTPUT node.

This feedback is accomplished by dividing the OUTPUT voltage with reference to the FET M1 source voltage using two impedances, Z1 and Z2. Generally, a gain of one half is optimum for dividing the operating voltage evenly across the two FETs M1 and M2. A feedback gain of about 0.5 can be achieved when impedance Z1 is substantially equal to impedance Z2.

Note that, in this particular configuration, the feedback gain will always be less than one. As such, the configuration can be referred to as a fractional feedback cascode circuit. Further note that the FETs M1 and M2 can be implemented as either P-channel FETs (PFET) or n-channel FETs (NFET), with the difference between the two configurations being the polarity of the connections at the source of FET M1 and the drain of FET M2.

Figure 2:
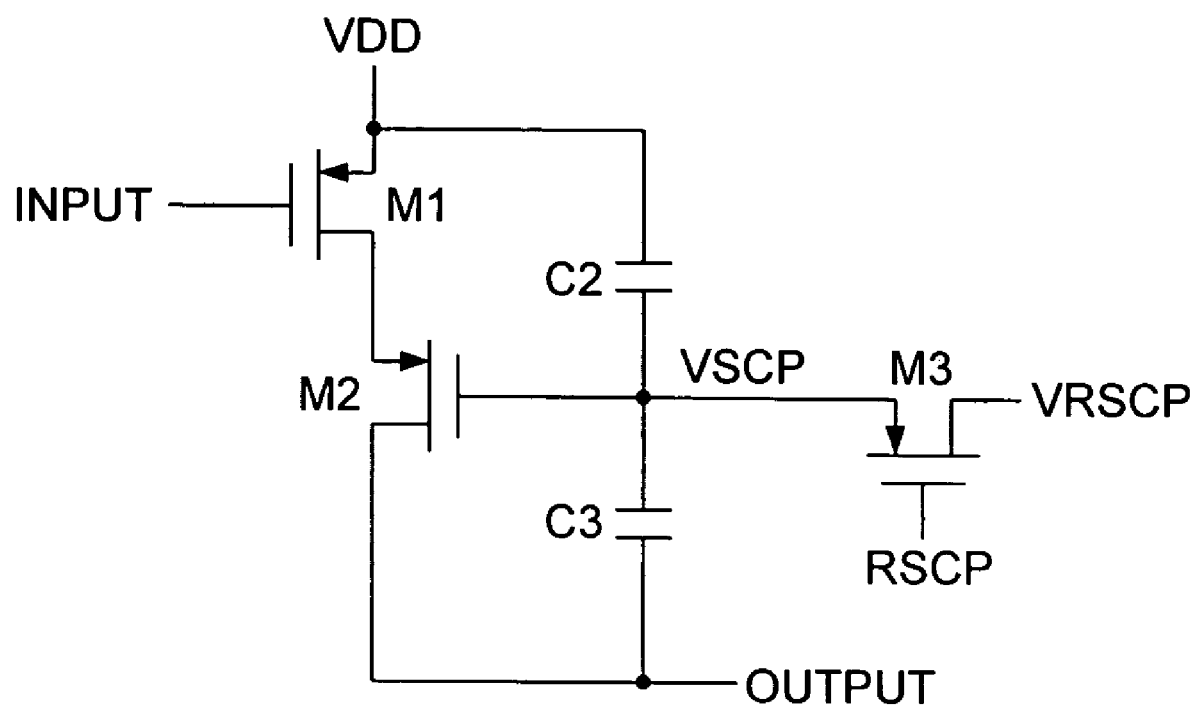
FIG. 2 illustrates a sliding cascode PFET circuit configured in accordance with one embodiment of the present invention.

FIG. 2 illustrates a sliding cascode PFET circuit configured in accordance with one embodiment of the present invention. As can be seen, a specific implementation of the bias VSCP generation with feedback is shown. In particular, the impedances Z1 and Z2 are implemented with capacitors C2 and C3, respectively, thereby providing AC feedback. A reset switch M3 is provided to set the DC operating point based on the voltage source VRSCP. Switch M3 is responsive to a control signal, RSCP.

In one embodiment, and as previously discussed in reference to FIG. 1, the capacitors C2 and C3 are substantially the same value (e.g., within +/−10% of one another). The feedback from the OUTPUT node provides a series voltage drop that is split evenly across the two FETs M1 and M2 (as opposed to one FET in conventional configurations). The actual values of C2 and C3, as well as the make-up and dimensions of the FETs M1, M2, and M3 will vary from one application to the next, depending on the particular application and semiconductor processing techniques employed, as will be appreciated in light of this disclosure.

In alternative embodiments, note that impedances Z1 and Z2 can be implemented with components other than capacitors. For example, C1 and C2 could be replaced by resistors (e.g., two like-value resistors to setup the desired bias VSCP and to provide a series voltage drop that is split evenly across the two FETs M1 and M2). In such a configuration, note that the reset switch M3 would not be required. Further note, however, that resistors typically use more power and are larger in area on an integrated circuit. Thus, the components selected to implement the feedback will depend on the particular application and the desired performance criteria.

An analogous sliding cascode circuit can be made for NFETs (for M1, M2, and M3), by simply reversing the polarity of the connections.

Integrator with Sliding Cascode Amplifier

Figure 3:
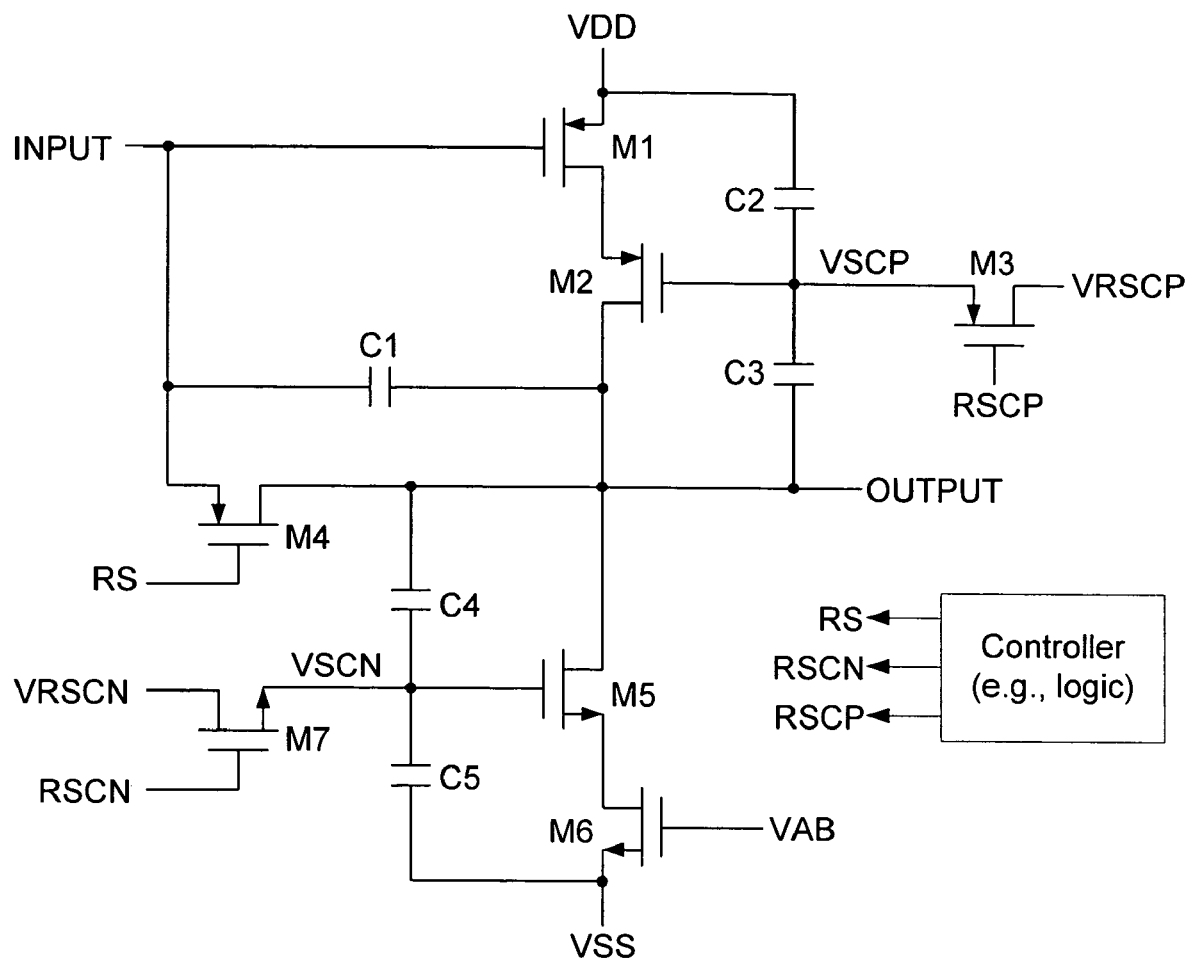
FIG. 3 illustrates an integrator circuit that includes a CMOS amplifier having both PFET and NFET sliding cascode circuits configured in accordance with one embodiment of the present invention.

FIG. 3 illustrates an integrator circuit that includes a CMOS amplifier having both PFET and NFET sliding cascode circuits configured in accordance with one embodiment of the present invention.

PFETs M1 and M2, and NFETs M5 and M6, form an amplifier. The amplifier input is provided at the INPUT node and the amplifier output is provided at the OUTPUT node. C1 is a feedback capacitor to implement the integration. PFET M4 is a reset switch for the integration process.

The sliding cascode amplifier uses two sliding cascode circuits configured in accordance with the principles of the present invention: a PFET sliding cascode circuit and an NFET sliding cascode circuit. The PFET sliding cascode circuit of the amplifier is implemented by PFETs M1, M2 and M3 and capacitors C2 and C3. The NFET sliding cascode circuit of the amplifier is implemented by NFETs M5, M6 and M7 and capacitors C4 and C5.

The controller is configured to provide various control signals. For instance, the controller can be configured to provide the reset control signal (RS) to open and close the reset switch M4 pursuant to an established integration scheme. Likewise, the controller can be configured to provide the reset control signal for the PFET cascode circuit (RSCP) to open and close the switch M3, as well as to provide the reset control signal for the NFET cascode circuit (RSCN) to open and close the switch M7.

In one particular embodiment, the controller is implemented with on-chip logic configured to deliver control signals RSCP and RSCN so as to simultaneously open switches M3 and M7, and then to deliver the control signal RS to open the reset switch M4. Such a delay between the delivery of the RSCP/RSCN and the RS control signals effectively enables the feedback of the cascode configuration, by ensuring that the voltage sources VRSCP and VRSCN are "off" before integration begins. In one embodiment, this delay is between 100.0 nanoseconds and 10.0 microseconds.

Note that the integrator with sliding cascode amplifier circuit illustrated in FIG. 3 can be fabricated using conventional CMOS semiconductor processing techniques, where the controller is implemented off-chip (e.g., field programmable gate array or other suitable processor). Alternatively, the control signals RSCP, RSCN and RS can be provided by separate controllers or other such sources. Also, note that each of the power supplies (VDD and VSS) and the voltage sources (VRSCP, VRSCN, and VAB) can be provided on or off chip.

In a ROIC-FPA application, the integrator with sliding cascode amplifier circuit shown in FIG. 3 could be repeated in the ROIC design for each pixel of the FPA. In such an embodiment, the detection signal generated by a pixel of the FPA would be provided to the INPUT node of the corresponding integrator with sliding cascode amplifier circuit. Further note that, in such an embodiment, the controller could be configured to provide the appropriate control signals to each integrator with sliding cascode amplifier circuit included in the ROIC.

In operation, switch M4 is closed (in response to RS from the controller) to reset the integrator, which initializes the integration process to an established reset voltage level. In one embodiment, the integration direction is downward (from high to low) and the established reset voltage is about one threshold below VDD. Thus, if VDD is about 6 VDC, the established reset voltage would be about 0.8 to 1.2 VDC below 6 VDC (i.e., about 5 VDC).

The sliding cascode biases (VSCP and VSCN) can also be reset during this integrator reset time. In more detail, switch M3 is also closed (in response to RSCP from the controller) to set the cascode bias VSCP for the established reset voltage level, based on the voltage source VRSCP (reset voltage for the PFET cascode circuit). Likewise, switch M7 is also closed (in response to RSCN from the controller) to set the cascode bias VSCN for the established reset voltage level, based on the voltage source VRSCN (reset voltage for the NFET cascode circuit).

The cascode switches M3 and M7 are then opened (in response to RSCP and RSCN, respectively, from the controller), followed by the reset switch M4 (in response to RSCP from the controller). As previously explained, the delay between opening the cascode switches M3/M7 and the reset switch M4 is to ensure that the feedback of the PFET and NFET sliding cascode circuits is enabled before the integration process begins. Various acceptable delays between the opening switches M3/M7 and M4 will be apparent in light of this disclosure.

Alternatively, some applications may not require a delay, where the reset switch M4 is opened before or simultaneously with the cascode switches M3 and M7. Note, however, that as long as the cascode switches M3 and M7 are closed, then the cascode circuit biases (VSCP and VSCN) will be controlled by the corresponding voltage source (VRSCP and VRSCN), and not by the corresponding voltage divider of the feedback impedances (C2/C3 and C4/C5).

Once the reset switch M4 is opened, all current flowing into the INPUT node is integrated on the integration capacitor, C1. The voltage at the OUTPUT node includes this integrated voltage change from the established reset voltage level. In this embodiment, the feedback is provided by capacitors C2 and C3 for the PFET sliding cascode circuit and by capacitors C4 and C5 for the NFET sliding cascode circuit. The NFET sliding cascode circuit of the amplifier (NFETs M5, M6 and M7 and capacitors C4 and C5) also sets the amplifier operating current, based on the amplifier bias voltage source, VAB.

One particular embodiment of the integrator with sliding cascode amplifier circuit shown in FIG. 3 is implemented in thin gate CMOS technology and is associated with the following components, power supplies, bias sources, and control signal parameters:

M1 = 5.0, 1.0 (width, length in microns)
M2 = 1.0, 0.8 (width, length in microns)

-continued

M3 = 0.5, 0.5 (width, length in microns)
M4 = 0.5, 1.0 (width, length in microns)
M5 = 1.0, 0.8 (width, length in microns)
M6 = 0.8, 5.0 (width, length in microns)
M7 = 0.5, 0.5 (width, length in microns)
C1, C2, C3, C4, C5 = 0.2 pF
VDD = 6.0 VDC
VSS = 0.0 VDC
VRSCP = One P threshold voltage below 5.5 V
(P threshold = $V_{GS}$ of FET M2 at operating current)
VRSCN = One N threshold voltage above 0.5 V
(N threshold = $V_{GS}$ of FET M5 at operating current)
RS = 0.0/6.0 V ↓ (low going 50 microsecond pulse)
RSCP = 0.0/6.0 V ↓ (low going 50 microsecond pulse)
RSCN = 0.0/5.0 V ↑ (high going 50 microsecond pulse)
VAB = One N threshold voltage above VSS
(N threshold = $V_{GS}$ of FET M6 at operating current)

In such a configuration, assume the output at the OUTPUT node is about 4 VDC. Here, the PFET cascode circuit would distribute about 1 VDC across each of PFETs M1 and M2 (i.e., (6 VDC−4 VDC)/2=1 VDC), and the NFET cascode circuit would distribute about 2 VDC across each of NFETs M5 and M6 (i.e., (4 VDC−0 VDC)/2=2 VDC). Thus, a full voltage swing from about 0.5 to about 5.5 VDC (accounting for loss across the FETs) would be enabled for the integrator with sliding cascode amplifier circuit, despite having been fabricated using a lower voltage rated thin oxide CMOS process. In addition to relatively large dynamic range, the integrator with sliding cascode amplifier circuit also provides desirable features such as increased radiation hardness, higher speed logic, and compactness.

Note that, even though components such as the capacitors C1, C2, and C3 may make the sliding cascode circuit relatively large, other circuits also included in the same integrated circuit could be more compact, given low voltage, high density CMOS fabrication processing (assuming those other circuits can accept the low voltage limitations of the CMOS process).

Sliding Cascode Buffer Circuit

Figure 4:
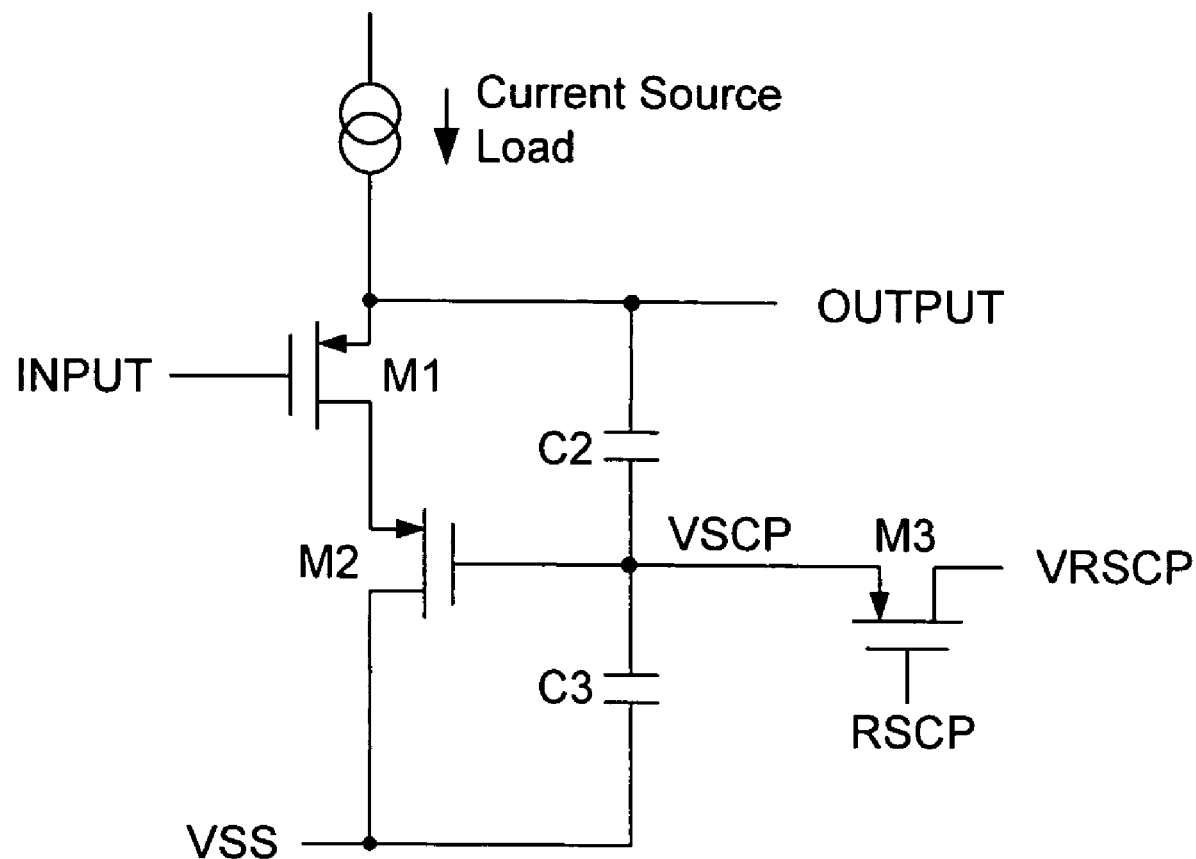
FIG. 4 illustrates a sliding cascode source follower circuit configured in accordance with one embodiment of the present invention.

FIG. 4 illustrates a sliding cascode source follower circuit configured in accordance with one embodiment of the present invention. A source follower is a near unity gain voltage buffer. Thus, the input voltage at the INPUT node would essentially be passed to the OUTPUT node, but the buffering action of the circuit would electrcially isolate the INPUT node from the OUTPUT node. Assuming the capacitors C2 and C3 are similar in value, the output voltage would be divided evenly across PFETs M1 and M2 as previously explained herein in reference to FIGS. 2 and 3.

The current source load could be implemented in a number of ways. For example, assuming the sliding cascode source follower circuit is implemented as an integrated circuit, the current source load could be implemented in conventional technology external to the integrated circuit.

Alternatively, the sliding cascode source follower circuit could be implemented on the integrated circuit using a resistor or a PFET sliding cascode circuit. Recall that the NFET sliding cascode circuit of the integrator shown in FIG. 3 is implemented by NFETs M5, M6 and M7 and capacitors C4 and C5. This NFET sliding cascode circuit is effectively an NFET current source load. Thus, a PFET current source load can also be implemented, by substituting PFETs for the NFETs, and reversing power supply polarities (i.e., switch VDD and VSS).

The foregoing description of the embodiments of the invention has been presented for the purposes of illustration and description. It is not intended to be exhaustive or to limit the invention to the precise form disclosed. Many modifications and variations are possible in light of this disclosure. For example, the feedback impedances that distribute voltage at the output node across the cascode circuit transistors, are substantially the same value to provide even distribution of the output across the two FETs. However, some applications may benefit from an imbalanced configuration where one impedance is greater than the other, thereby causing more of the output voltage to drop across one of the FETs relative to the other FET. Note, however, that the overall improvement to voltage swing of the integrated circuit remains. It is intended that the scope of the invention be limited not by this detailed description, but rather by the claims appended hereto.

What is claimed is:

1. A sliding cascode circuit comprising:
a first transistor having a gate, source and drain, with its source coupled to a first voltage supply and its gate adapted to receive an input signal;
a second transistor having a gate, source and drain, with its drain coupled to an output node, and its source coupled to the drain of the first transistor;
a first impedance coupled from the first voltage supply to the gate of the second transistor; and
a second impedance coupled from the gate of the second transistor to the output node;
wherein the first and second impedances have substantially the same value and form a feedback network that distributes voltage at the output node across the first and second transistors, thereby increasing maximum voltage swing of the circuit relative to a single transistor configuration.

2. The circuit of claim 1 further comprising: a third transistor having a gate, source and drain, with its drain coupled to a first bias voltage source, its source coupled to the gate of the second transistor, and its gate adapted to receive control signals that turn the third transistor on and off in order to set a DC operating point of the circuit.

3. The circuit of claim 1 wherein the first and second impedances are capacitors.

4. The circuit of claim 1 wherein the first and second impedances are resistors of substantially the same value.

5. The circuit of claim 2 wherein the first, second, and third transistors are PFETs.

6. An integrator with sliding cascode amplifier circuit, comprising:
a first transistor having a gate, source and drain, with its source coupled to a first voltage supply and its gate adapted to receive an input signal;
a second transistor having a gate, source and drain, with its drain coupled to an output node, and its source coupled to the drain of the first transistor;
a first impedance coupled from the first voltage supply to the gate of the second transistor, wherein said first impedance is a first capacitor;
a second impedance coupled from the gate of the second transistor to the output node, wherein said second impedance is a second capacitor; and
an integration capacitor coupled from the input node to the output node;
wherein the first and second impedances form a feedback network that distributes voltage at the output node across the first and second transistors, thereby increasing maximum voltage swing of the circuit relative to a single transistor configuration.

7. The circuit of claim 6 further comprising:
a cascode reset switch operatively coupled to the circuit and for coupling a reset voltage to the feedback network in response to a cascode reset signal; and
an integration reset switch operatively coupled to the circuit and for enabling an integration reset function in response to an integration reset signal.

8. The circuit of claim 7 further wherein the cascode reset switch is opened before the integration reset switch is opened to begin integration.

9. The circuit of claim 6 wherein the first and second impedances have substantially the same value, thereby enabling voltage at the output node to be evenly distributed across the first and second transistors.

10. The circuit of claim 6 wherein the first and second capacitors are substantially the same value.

11. The circuit of claim 6 further comprising:
a third transistor having a gate, source and drain, with its source coupled to a second voltage supply and its gate adapted to receive an amplifier bias voltage signal;
a fourth transistor having a gate, source and drain, with its drain coupled to the output node, and its source coupled to the drain of the third transistor;
a third impedance coupled from the second voltage supply to the gate of the fourth transistor; and
a fourth impedance coupled from the gate of the fourth transistor to the output node;
wherein the third and fourth impedances form a second feedback network that distributes voltage at the output node across the third and forth transistors, thereby further increasing the maximum voltage swing of the circuit.

12. The circuit of claim 11 further comprising:
a cascode reset switch operatively coupled to the circuit and for coupling a coupling a reset voltage to the second feedback network in response to a cascode reset signal; and
an integration reset switch operatively coupled to the circuit and for enabling an integration reset function in response to an integration reset signal.

13. The circuit of claim 12 further wherein the cascode reset switch is opened before the integration reset switch is opened to begin integration.

14. The circuit of claim 11 wherein the third and fourth impedances have substantially the same value, thereby enabling voltage at the output node to be evenly distributed across the third and fourth transistors.

15. The circuit of claim 11 wherein the third and fourth impedances are capacitors.

16. The circuit of claim 15 wherein the capacitors are substantially the same value.

17. A sliding cascode source follower circuit comprising:
a first transistor having a gate, source and drain, with its source providing an output node and adapted for coupling with a current source, and its gate adapted to receive an input signal;
a second transistor having a gate, source and drain, with its drain coupled to a first voltage supply, and its source coupled to the drain of the first transistor;
a first impedance coupled from the first voltage supply to the gate of the second transistor; and
a second impedance coupled from the gate of the second transistor to the output node;
wherein the first and second impedances form a feedback network that distributes an output voltage at the output node across the first and second transistors wherein said input signal at said gate of said first transistor is substantially similar to said output signal at said source of said first transistor, thereby increasing maximum voltage swing of the circuit relative to a single transistor configuration.

18. A sliding cascode circuit fabricated using a semiconductor process associated with a voltage rating for a single transistor the circuit comprising:
- a first transistor having a gate, source and drain, with its source operatively coupled to a first voltage supply and its gate adapted to receive an input signal;
- a second transistor having a gate, source and drain, with its drain operatively coupled to an output node, and its source operatively coupled to the drain of the first transistor;
- a third transistor having a gate, source and drain, with its drain operatively coupled to a first bias voltage source, its source coupled to the gate of the second transistor, and its gate adapted to receive control signals that turn the third transistor on and off in order to set a DC operating point of the circuit; and
- a feedback network operatively coupled to the first, second and third transistors, that distributes voltage at the output node across the first, second and third transistors, thereby increasing maximum voltage swing of the circuit relative to the voltage rating for a single transistor.

19. The circuit of claim 18 wherein the feedback network is configured to enable voltage at the output node to be evenly distributed across the first and second transistors.

* * * * *